United States Patent [19]
Sasaki

[11] Patent Number: 6,069,389
[45] Date of Patent: *May 30, 2000

[54] SEMICONDUCTOR NON-VOLATILE MEMORY DEVICE HAVING FLOATING GATE TYPE FIELD EFFECT TRANSISTORS FOR MEMORY CELLS BIPOLAR TRANSISTORS FOR A HIGH-SPEED CIRCUIT

[75] Inventor: Masakazu Sasaki, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/943,253

[22] Filed: Oct. 17, 1997

[30] Foreign Application Priority Data

Oct. 18, 1996 [JP] Japan .................................. 8-297620

[51] Int. Cl.$^7$ .................................................. H01L 29/76
[52] U.S. Cl. .......................... 257/370; 257/315; 257/375; 438/234
[58] Field of Search ................................... 257/315, 370, 257/375; 438/201, 207, 234

[56] References Cited

U.S. PATENT DOCUMENTS

| | | | |
|---|---|---|---|
| 5,005,066 | 4/1991 | Chen | 257/315 |
| 5,248,624 | 9/1993 | Icel et al. | 438/201 |

FOREIGN PATENT DOCUMENTS 63-3452  1/1988  Japan .

*Primary Examiner*—Mahshid Saadat
*Assistant Examiner*—George C. Eckert, II
*Attorney, Agent, or Firm*—Sughrue, Mion, Zinn, Macpeak & Seas, PLLC

[57] ABSTRACT

A semiconductor flash memory device includes floating gate type field effect transistors serving as memory cells, field effect transistors for forming peripheral circuits and bipolar transistors for forming other peripheral circuits expected to drive heavy load at high speed, and both of the floating gate electrodes and the emitter electrodes and both of the control gate electrodes and the gate electrodes are patterned from a first doped polysilicon and a second doped polysilicon so as to simplify a process sequence for fabricating the semiconductor flash memory device.

8 Claims, 9 Drawing Sheets

SEMICONDUCTOR NON-VOLATILE MEMORY DEVICE HAVING FLOATING GATE TYPE FIELD EFFECT TRANSISTORS FOR MEMORY CELLS BIPOLAR TRANSISTORS FOR A HIGH-SPEED CIRCUIT

FIELD OF THE INVENTION

This invention relates to a semiconductor non-volatile memory device and, more particularly, to a semiconductor non-volatile memory device such as flash memory device having floating gate type field effect transistors for memory cells and a process of fabrication thereof.

DESCRIPTION OF THE RELATED ART

A semiconductor nonvolatile memory device does not require a periodical refreshing for keeping pieces of data information, and an erasable program read only memory device and an electrically erasable and programmable read only memory device are typical examples of the semiconductor non-volatile memory device. A semiconductor flash memory is a kind of electrically erasable and programmable read only memory, and data bits are concurrently erased from all of the memory cells or one of the memory cell blocks.

FIGS. 1A to 1G illustrate a prior art process for fabricating the prior art semiconductor flash memory. The prior art process starts with preparation of a p-type silicon substrate 1. A surface portion of the p-type silicon substrate 1 is selectively oxidized so as to grow a thick field oxide layer 2. The thick field oxide layer 2 separates the surface portion into active areas, and the active areas 3a/3b are respectively assigned to a memory cell and an n-channel enhancement type field effect transistor of a complementary field effect transistor. Although a p-channel enhancement type field effect transistor and the n-channel enhancement type field effect transistor form in combination the complementary transistor, only the n-channel enhancement type field effect transistor is shown in the figures.

P-type dopant impurity and n-type dopant impurity are selectively introduced into the active areas, and form a p-type well 4 and an n-type well 5. The active areas 3a/3b are incorporated in the p-type well 4, and a channel doping is carried out by introducing p-type dopant impurity and n-type dopant impurity into the wells. Tunnel gate oxide films 6a and 7a are grown on the active areas 3a/3b, and are thin enough to allow Fowler-Nordheim tunneling current to pass therethrough. The resultant semiconductor structure is illustrated in FIG. 1A.

Subsequently, polysilicon is deposited over the entire surface of the resultant structure, and the polysilicon layer is patterned into a polysilicon strip 6b through lithographic techniques. The polysilicon strip 6b remains over the active area 3a as shown in FIG. 1B.

The polysilicon strip 6b is covered with a composite dielectric film structure 6c, and a silicon oxide film, a silicon nitride film and a silicon oxide film form the composite dielectric film structure 6c. The resultant semiconductor structure is shown in FIG. 1C.

Using the composite dielectric film structure 6c as an etching mask, the tunnel gate oxide film 7a is etched away from the active area 3b, and only the tunnel gate oxide film 6a is left on the active area 3a. A gate oxide film 7b is grown to 10 nanometers to 25 nanometers thick over the active area 3b as shown in FIG. 1C.

Subsequently, n-type doped polysilicon is deposited to 200 nanometers to 400 nanometers thick over the entire surface of the resultant semiconductor structure. The n-type doped polysilicon layer may be replaced with a laminated structure of a polysilicon layer and a refractory metal layer such as tungsten or molybdenum.

A photo-resist etching mask (not shown) is formed on the composite dielectric film structure 6c, and the n-type doped polysilicon layer is formed into a control gate electrode 6d and an n-type doped polysilicon strip 7c. Using the same photo-resist etching mask, the composite dielectric film structure 6c and the polysilicon strip are successively etched away so as to form a gate insulating structure 6e and a floating gate electrode 6f. Thus, the control gate electrode 6d, the gate insulating structure 6e and the floating gate electrode 6f are formed on the tunnel oxide layer 6a, and as a whole constitute a gate structure 6g. The photo-resist etching mask is stripped off.

Using the gate structure 6g as an ion-implantation mask, n-type dopant impurity is ion implanted into the active area 3a, and an n-type source region 6h and an n-type drain region 6j are formed in the active area on both sides of the channel region beneath the gate structure 6g. The resultant semiconductor structure is shown in FIG. 1D.

Subsequently, a photo-resist etching mask (not shown) is formed on the resultant semiconductor structure, and the n-type doped polysilicon strip 7c is selectively etched away so as to form a gate electrode 7d as shown in FIG. 1E. The photo-resist etching mask is stripped off.

Using the gate electrode 7d as an ion-implantation mask, n-type dopant impurity is lightly ion implanted into the active area 3b, and forms lightly doped n-type regions 7e. Silicon oxide is deposited to 100 nanometers to 200 manometers thick over the entire surface of the resultant semiconductor structure, and the silicon oxide layer is anisotropically etched without an etching mask. As a result, side wall spacers 6k and 7f are formed on both side surfaces of the gate structure 6g and both side surfaces of the gate electrode 7d.

Using the gate electrode 7d and the side wall spacers 7f as an ion-implantation mask, n-type dopant impurity is heavily ion implanted into the active area 3b, and forms a heavily doped n-type source region 7g and a heavily doped n-type drain region 7h as shown in FIG. 1 F.

The tunnel gate oxide layer 6a, the gate structure 6g, the n-type source region 6h, the n-type drain region 6j and the side wall spacers 6k form in combination a floating gate type field effect transistor, and the floating gate type field effect transistor stores a data bit. Thus, the floating gate type field effect transistor serves as a memory cell 6. On the other hand, the gate oxide layer 7b, the gate electrode 7d, the side wall spacers 7f, the lightly doped n-type regions 7e and the heavily doped n-type source/drain regions 7g/7h as a whole constitute an n-channel enhancement type field effect transistor 7.

Insulating material is deposited over the floating gate type field effect transistor 6 and the n-channel enhancement type field effect transistor 7, and the floating gate type field effect transistor 6 and the n-channel enhancement type field effect transistor 7 are covered with an inter-level insulating layer 8a. Contact holes are formed in the inter-level insulating layer 8a, and the source/drain regions 6h/6j/7g/7h and the gate electrode 7d are exposed to the contact holes. Conductive metal such as aluminum is deposited over the entire surface of the resultant semiconductor structure. The aluminum fills the contact holes, and swells into an aluminum layer. A photo-resist etching mask (not shown) is patterned on the aluminum layer, and the aluminum layer is formed into metal wirings 9 as shown FIG. 1G. The photo-resist etching mask is stripped off.

A large number of memory cells 6 form a memory cell array, and the complementary transistor forms a part of the peripheral circuit such as an address decoder circuit for selecting a memory cell from the array. One of the basic requirement for the semiconductor non-volatile memory device is to increase the data storage density. Other requirements are to enhance the access speed and to decrease power consumption.

If the n-channel enhancement type field effect transistor 7 and the associated p-channel enhancement type field effect transistor are enlarged, the peripheral circuit achieves the given task at higher speed, and the access speed is improved. However, the large field effect transistor occupies wide real estate, and decreases the integration density and, accordingly, the data storage density.

Japanese Patent Publication of Unexamined Application No. 63-3452 proposes to use a bipolar transistor as a high speed circuit component. The bipolar transistor disclosed in the Japanese Patent Publication of Unexamined Application serves as a driver of a static random access memory cell connected to an electrically erasable and programmable read only memory cell. The bipolar transistor drives a large amount of current at high speed, and occupies the real estate narrower than that of the large field effect transistor. However, the bipolar transistor is fabricated through a complicated process sequence, and increases the production cost of the semiconductor non-volatile memory device. The Japanese patent Publication of Unexamined Application does not teach how the bipolar transistor and the component field effect transistors are fabricated. For this reason, it is natural to independently fabricate the bipolar transistor and the component field effect transistors.

SUMMARY OF THE INVENTION

It is therefore an important object of the present invention to provide a semiconductor non-volatile memory device which has a large data storage density without sacrifice of an access speed.

To accomplish the object, the present invention proposes to replace a large field effect transistor with a bipolar transistor.

In accordance with one aspect of the present invention, there is provided a semiconductor non-volatile memory device fabricated on a semiconductor substrate, comprising a floating gate type field effect transistor serving as a memory cell and including a first gate insulating layer covering a first channel forming region in a first portion of the semiconductor substrate, a floating gate electrode formed on the first gate insulating layer and implemented by a first portion a first conductive layer, a second gate insulating layer formed on the floating gate electrode, a control gate electrode formed on the second gate insulating layer and implemented by a first portion of a second conductive layer and a first source region and a first drain region formed on both sides of the first channel forming region in the first portion, a first field effect transistor forming a part of a peripheral circuit and including a third gate insulating layer covering a second channel forming region in a second portion of the semiconductor substrate isolated from the first portion, a first gate electrode formed on the third gate insulating layer and a second source region and a second drain region formed on both sides of the second channel forming region in the second portion, and a bipolar transistor forming a part of another peripheral circuit operative at higher speed than the peripheral circuit and including a collector region formed in a third portion of the semiconductor substrate isolated from the first and second portions, a base region formed in the collector region, an emitter region formed in the base region and an emitter electrode held in contact with the emitter region, implemented by a second portion of the first conductive layer and heavier in dopant concentration than the floating electrode.

The first gate electrode of the first field effect transistor may be implemented by a second portion of the second conductive layer.

The semiconductor non-volatile memory device may further comprise a second field effect transistor having a second gate electrode implemented by a third portion of the second conductive layer.

The bipolar transistor may further include a collector electrode held in contact with a collector contact region and implemented by a third portion of the first conductive layer.

The second source region, the second drain region and the emitter electrode may be doped with a first part of a first dopant impurity, a second part of the first dopant impurity and a third part of the first dopant impurity.

The third source and drain regions of the second field effect transistor and a graft base region of the bipolar transistor may be doped with a first portion of a second dopant impurity and a second portion of the second dopant impurity.

BRIEF DESCRIPTION OF THE DRAWINGS

The features and advantages of the semiconductor non-volatile memory device will be more clearly understood from the following description taken in conjunction with the accompanying drawings in which.

DESCRIPTION OF THE PREFERRED EMBODIMENTS

First Embodiment

Figure 1A:
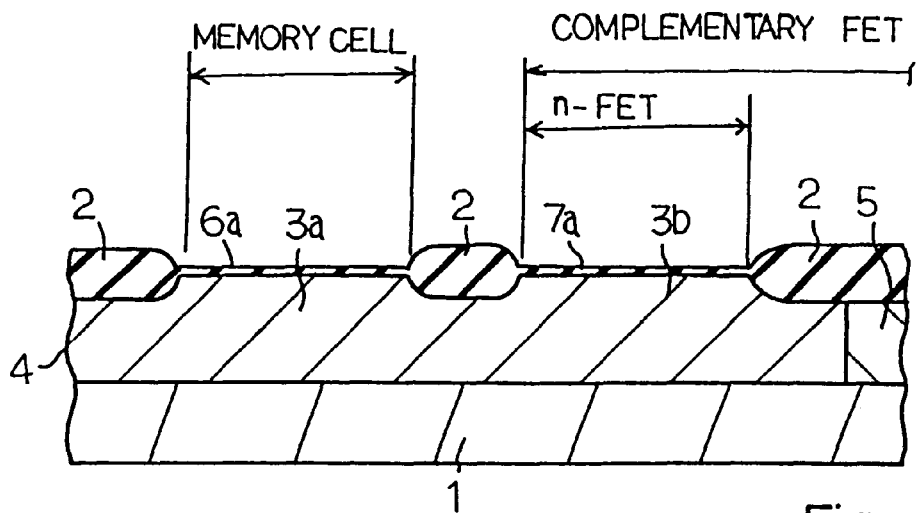
FIGS. 1A to 1G are cross sectional views showing the prior art process for fabricating the semiconductor flash memory device.
Figure 1B:
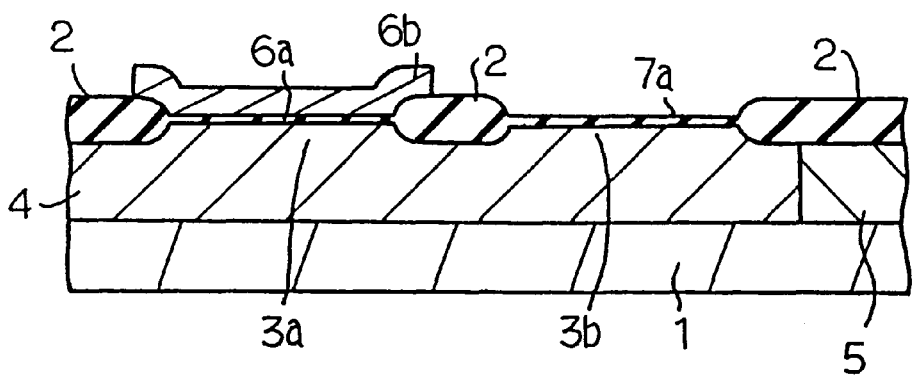
Figure 1C:
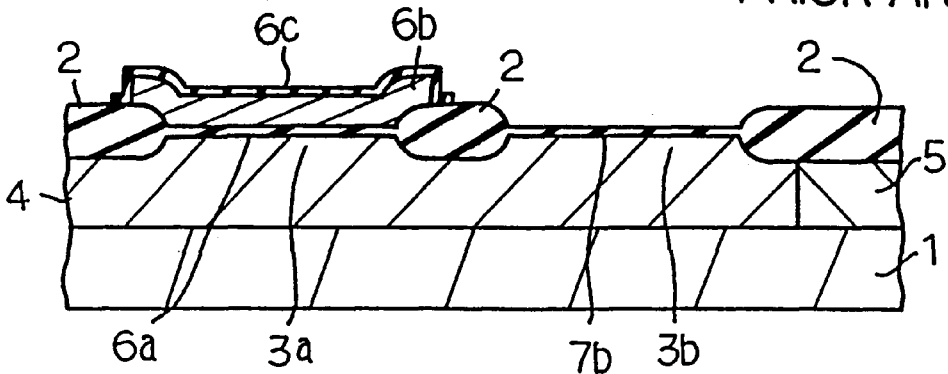
Figure 1D:
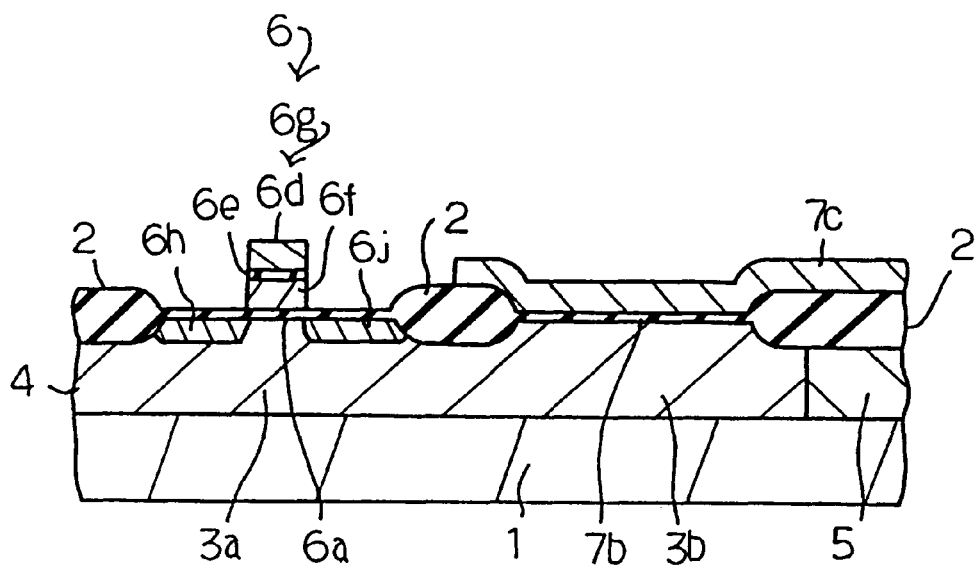
Figure 1E:
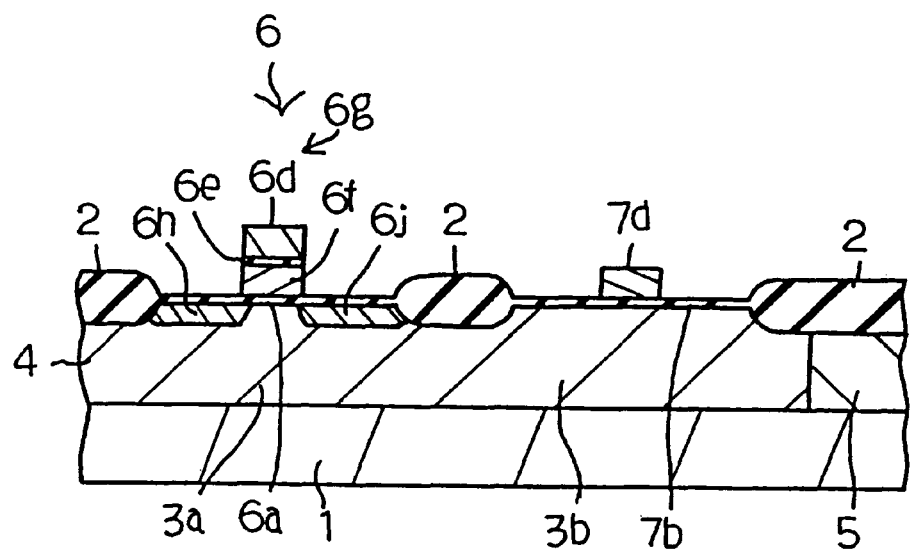
Figure 1F:
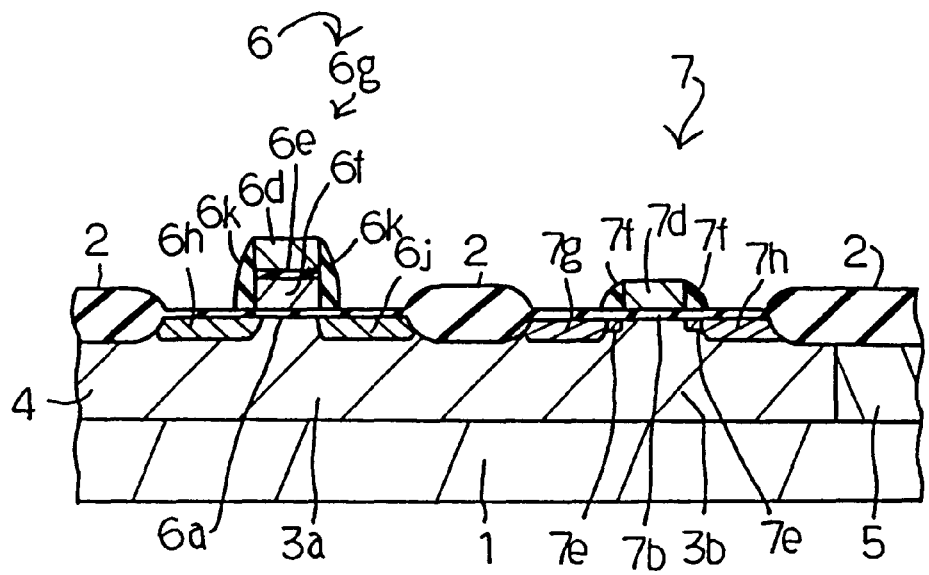
Figure 1G:
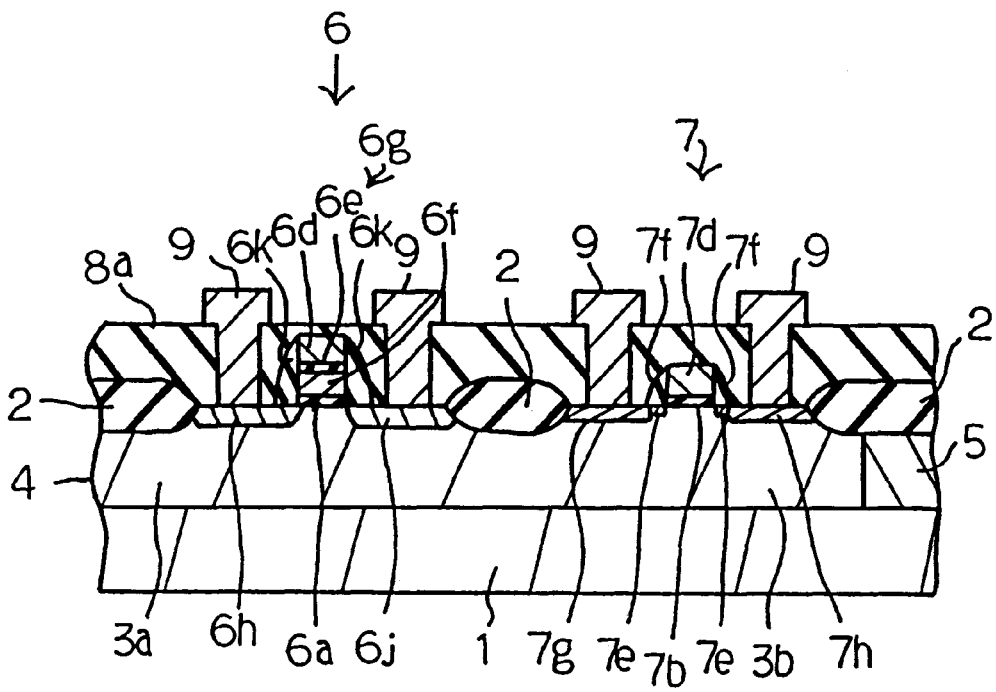
Figure 2:
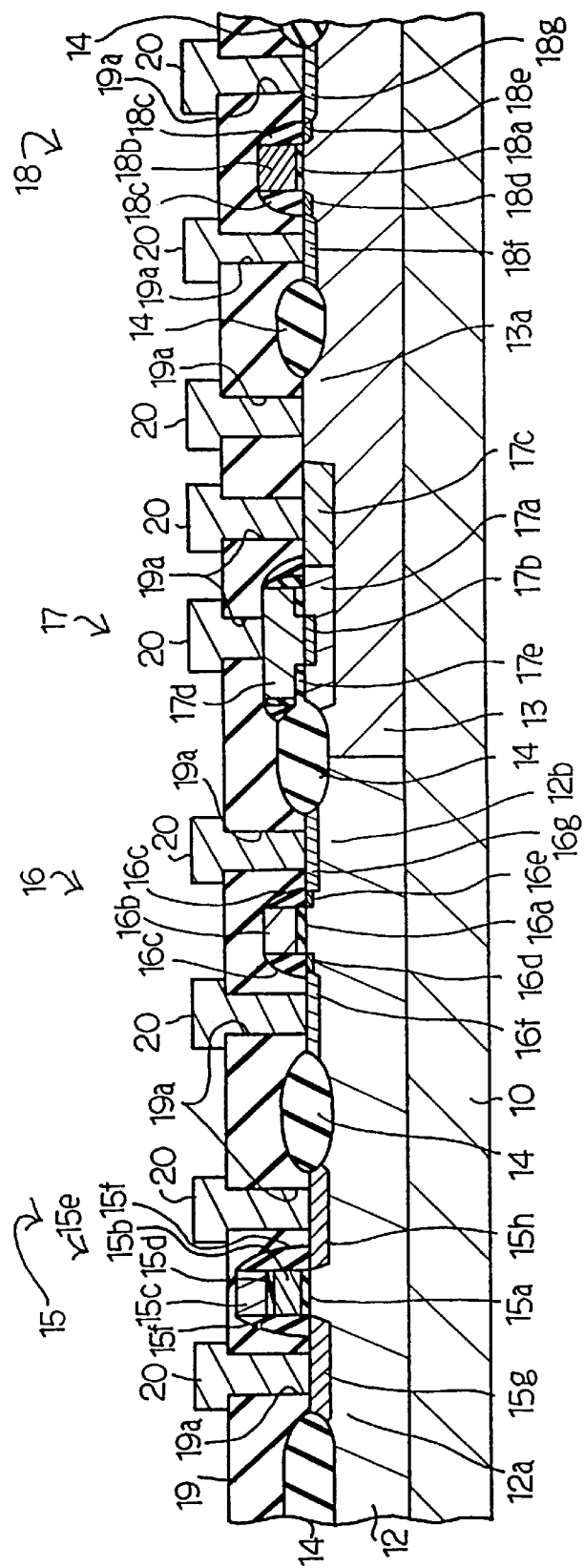
FIG. 2 is a cross sectional view showing the structure of a semiconductor non-volatile memory device according to the present invention.

Referring to FIG. 2 of the drawings, a semiconductor non-volatile memory device such as, for example, a semiconductor flash memory device embodying the present invention is fabricated on a p-type semiconductor substrate 10. A p-type well 12 and an n-type well 13 are formed in a surface portion of the p-type semiconductor substrate 10, and a thick field oxide layer 14 separates the p-type well 12 and the n-type well 13 into active areas. In this instance, the thick field oxide layer 14 ranges from 400 nanometers to 600 nanometers in thickness. The p-type active areas 12a/12b are assigned to a floating gate type field effect transistor 15 and an n-channel enhancement type field effect transistor 16, and the n-type active areas 13a/13b are assigned to an n-p-n type bipolar transistor 17 and a p-channel enhancement type field effect transistor 18.

The floating gate type field effect transistor 15 includes a tunnel gate oxide layer 15a, a floating gate electrode 15b formed on the tunnel gate oxide layer 15a, a control gate electrode 15c formed over the floating gate electrode 15b and an insulating film structure 15d inserted between the floating gate electrode 15b and the control gate electrode 15c. In this instance the tunnel gate oxide layer 15a is 8 nanometers to 15 nanometers thick, and the floating gate electrode 15b is 150 nanometers to 400 nanometers thick. An oxide layer, a nitride layer and an oxide layer are laminated on the floating gate electrode 15b, and form in combination the insulating fill structure 15c. The control gate electrode 15d is formed of n-type doped polysilicon, and ranges from 200 nanometers to 400 nanometers in thickness. The tunnel gate oxide layer 15a, the floating gate electrode 15b, the insulating film structure 15d and the control gate electrode 15c as a whole constitute a (gate structure 15e, and a conductive channel takes place beneath the gate structure 15e. Side wall spacers 15f are formed on both sides of the gate structure 15e, and an n-type source region 15g and an n-type drain region 15h are formed in the active area, and the conductive channel connects the n-type source region 15g and the n-type drain region 15h. The floating, gate type field effect transistor serves as a memory cell.

The n-channel enhancement type field effect transistor 16 includes a gate oxide layer 16a, a gate electrode 16b formed on the gate oxide layer 16a, side wall spacers formed on both sides of the gate electrode 16b, lightly doped source/ drain regions 16d/16e and heavily doped source/drain regions 16f/16g. The lightly doped source/drain regions 16d/16e are aligned with the side surfaces of the gate electrodes 16b, and the heavily doped source/drain regions 16f/16g are aligned with the side wall spacers 16c. The gate oxide layer 16a is 12 nanometers to 25 nanometers thick.

The p-channel enhancement type field effect transistor 18 includes a gate oxide layer 18a, a gate electrode 18b on the gate oxide layer 18a, side wall spacers 18c formed on both sides of the gate electrode 18b, lightly doped source/drain regions 18d/18e aligned with the side surfaces of the gate electrode 18b and heavily doped source/drain regions 18f/18g aligned with the side wall spacers 18c. The gate oxide layer 18a, the gate electrode 18b and the side wall spacers 18c are concurrently formed together with the gate oxide layer 16a, the gate electrode 16 and the side wall spacers 16c. However, photo-resist ion implantation masks alternately cover the lightly doped source/drain regions 18d/18e and the lightly doped source/drain regions 16d/16e, and the n-type dopant impurity and p-type dopant impurity are selectively introduced into the lightly doped source/drain regions 16d/16e and the lightly doped source/drain regions 18d/18e, respectively. Similarly, the heavily doped source/ drain regions 18f/18g and the heavily doped source/drain regions 16f/16g are alternately covered with photo-resist ion implantation masks, and the n-type dopant impurity and p-type dopant impurity are selectively introduced into the heavily doped source/drain regions 16f/16g and the heavily doped source/drain regions 18f/18g.

The n-p-n type bipolar transistor 17 includes a p-type base region 17a, an n-type emitter region 17b nested in the base region 17a and a p-type graft base region 17c contiguous to the p-type base region 17a. The n-type well 13 serves as an n-type collector. The emitter region 17b is formed together with the heavily doped n-type source/drain regions 16f/16g, and the graft base region 17c is formed together with the heavily doped p-type source/drain regions 18f/18g. The n-p-n type bipolar transistor 17 further includes an n-type emitter electrode 17d held on contact with the n-type emitter region 17b, and an insulating layer 17e spaces the emitter electrode 17d from the p-type base region 17a. The emitter electrode 17d and the floating gate electrode 15b are concurrently formed from a polysilicon layer. However, the emitter electrode 17d is larger in dopant concentration than the floating gate electrode 15b, because the n-type dopant impurity is concurrently introduced into the heavily doped n-type source/drain regions 16f/16g and the emitter electrode 17d. The heavily doped n-type dopant impurity is diffused from the emitter electrode 17d into the emitter region 17b. The dopant concentration of the emitter region 17b is of the order of $1 \times 10^{20}$ atoms/cm$^3$. On the other hand, the erasing speed and the data holding characteristics are affected by the dopant concentration of the floating gate electrode 15b, and the appropriate dopant concentration of the floating plate electrode 15b ranges from $1 \times 10^9$ atoms/cm$^3$ to $5 \times 10^{19}$ atoms/cm$^3$.

The semiconductor non-volatile memory device further includes an inter-level insulating layer 19, and the floating gate type field effect transistor 15, the n-channel enhancement type field effect transistor 16, the n-p-n type bipolar transistor 17 and the p-channel enhancement type field effect transistor 18 are covered with the inter-level insulating layer 19. The inter-level insulating layer 19 is formed of silicon oxide, and ranges from 500 nanometers to 1000 nanometers in thickness.

Contact holes 19a are formed in the inter-level insulating layer 19, and metal wirings 20 are selectively connected to the source/drain regions 15g/15h/16f/16g/18f/18g, the electrodes 15c, 16b/17d/15b, the graft base 17c and the collector 13. In this instance, the n-channel enhancement type field effect transistor 16 and the p-channel enhancement type field effect transistor 18 form in combination a complementary transistor, and the complementary transistor forms a part of a peripheral circuit. The bipolar transistor 17 also forms a part of another peripheral circuit such as an address decoder, and the peripheral circuit implemented by the bipolar transistor is expected to operate at higher speed than the peripheral circuit implemented by the complementary transistor.

The bipolar transistor 17 drives heavy load at a high-speed for the high-speed peripheral circuits without increase of occupation area.

Subsequently, description is made on a process for fabricating the semiconductor non-volatile memory device with reference to FIGS. 3A to 3E. Although the p-channel enhancement type field effect transistor 18 is not shown in the figures, the p-channel enhancement type field effect transistor 18 is fabricated as similar to the n-channel enhancement type field effect transistor 16.

The process starts with preparation of the p-type semiconductor substrate 10. The p-type semiconductor substrate 10 is selectively oxidized, and the thick field oxide layer 14 is selectively grown to 400 nanometers to 600 nanometers thick on the surface portion of the p-type semiconductor substrate 10. A photo-resist ion implantation mask (not shown) is patterned on the resultant semiconductor structure, and exposes a predetermined area to p-type dopant impurity. The p-type dopant impurity forms the p-type well 12. The photo-resist ion implantation mask is stripped off, and another photo-resist ion implantation mask (not shown) is patterned on the resultant semiconductor structure. The photo-resist ion implantation mask exposes another area to n-type dopant impurity, and the n-type dopant impurity forms the n-type well 13. The thick field oxide layer 14 defines the active areas respectively assigned to the floating gate type field effect transistor 15 and the n-channel enhancement type field effect transistor 16 in the p-type well 12 and the other active areas respectively assigned to the bipolar transistor 17 and the p-channel enhancement type field effect transistor 18 in the n-type well 13.

Figure 3A:
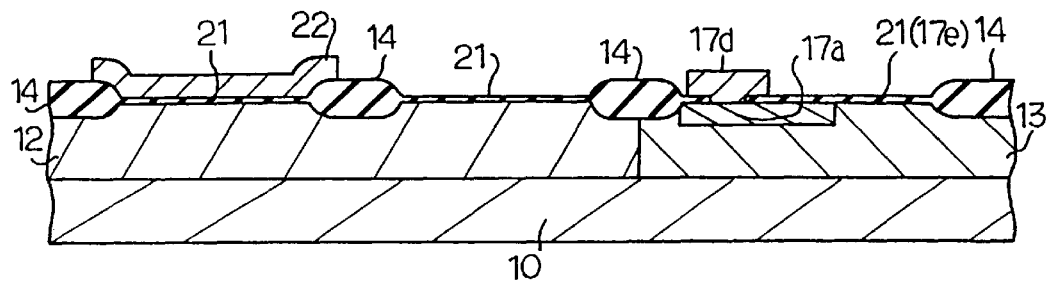
FIGS. 3A to 3E are cross sectional views showing a process for fabricating the semiconductor non-volatile memory device shown in FIG. 2.
Figure 3B:
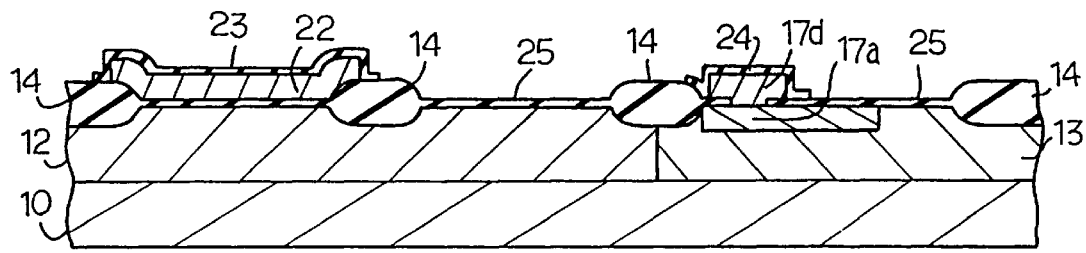

A channel doping is carried out for adjusting the threshold levels of the field effect transistors 15/16/18 to appropriate values, respectively. The base region 17a is formed during tile channel doping. Silicon oxide is grown to 8 nanometers to 15 nanometers thick on the active areas, and the active areas are covered with thin silicon oxide layers 21, respectively. The thin silicon oxide layer 21 in the leftmost active area serves as the tunnel gate oxide layer 15a, and the thin silicon oxide layer 21 over the base region 17a serves as the insulating layer 17e. An emitter contact hole is formed in the insulating layer 17e. Lightly doped n-type polysilicon is deposited to 150 nanometers to 400 nanometers thick over the entire surface of the resultant semiconductor structure, and a photo-resist etching mask (not shown) is provided on the lightly-doped n-type polysilicon layer. The lightly-doped n-type polysilicon layer is partially etched away so as to leave a polysilicon strip 22 and the emitter electrode 17d as shown in FIG. 3A.

Subsequently, the polysilicon strip 22 and the emitter electrode 17d are covered with composite dielectric films 23 and 24. In this instance, a silicon nitride film sandwiched between silicon oxide films serves as each of the composite dielectric films 23 and 24. The composite dielectric films 23/24 may be formed as follows. A surface portion of the polysilicon strip 22 and a surface portion of the emitter electrode 17d are oxidized, and silicon nitride is deposited over the silicon oxide films. Surface portions of the silicon nitride films are oxidized so as to form the three-level composite dielectric films 23/24.

Using the composite dielectric films 23/24 as an etching mask, the silicon oxide layers 21 are etched away from the active areas for the field effect transistors 16/18 and the bipolar transistor 17, and silicon oxide is grown to 10 nanometers to 25 nanometers on the exposed active areas for forming silicon oxide layers 25. The silicon oxide layers 25 on the active areas for the field effect transistors 16/18 serve as the gate oxide layers 16a/15a. The resultant semiconductor structure is show in FIG. 3B.

N-type doped polysilicon is deposited to 200 nanometers to 400 nanometers thick over the entire surface of the resultant semiconductor structure, and the composite dielectric films 23/24, the thick field oxide layer 14 and the silicon oxide layers 25 are covered with an n-type doped polysilicon layer.

A photo-resist etching mask (not shown) is patterned on the n-type doped polysilicon layer, and the n-type doped polysilicon layer is selectively etched away so as to leave the control gate electrode 15c and an n-type doped polysilicon strip 26. Using the photo-resist etching mask, the composite dielectric film 23 and the n-type doped polysilicon strip 22 are further etched, and the gate structure 15e is formed on the tunnel gate oxide layer 15a. The photo-resist etching mask is stripped off.

Figure 3C:
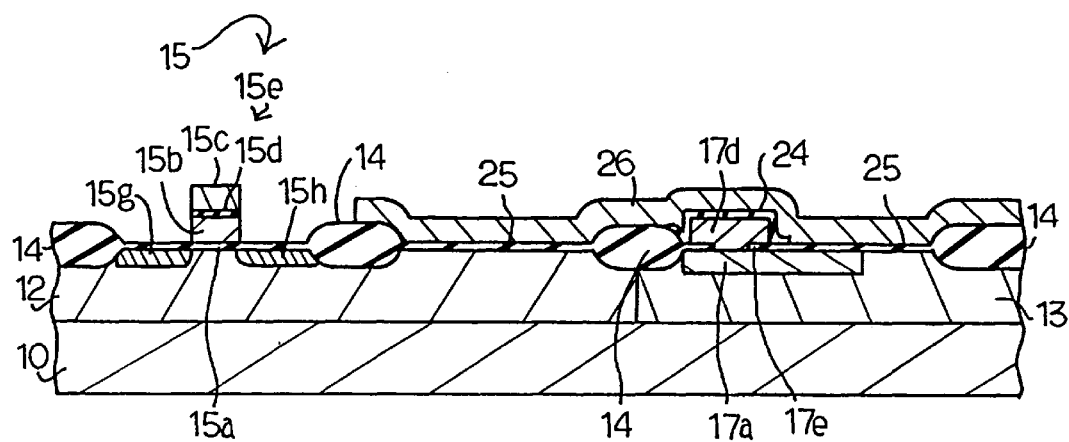

Using the gate structure 15e as an etching mask;, n-type dopant impurity is ion implanted into the active area assigned to the floating gate type field effect transistor 15. The n-type dopant impurity is activated through a heat treatment, and forms the n-type source region 15g and the n-type drain region 15h as shown in FIG. 3C.

Figure 3D:
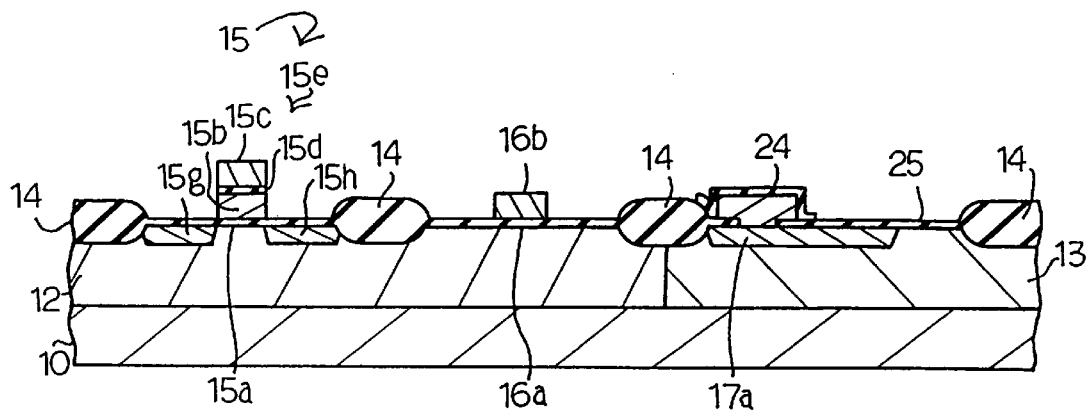

A photo-resist etching mask (not shown) is formed on the n-type doped polysilicon strip 26, and the n-type doped polysilicon strip 26 is patterned into the gate electrodes 16b/18b. The silicon oxide layers 25 and the composite dielectric film 24 prevent the emitter electrode 17d, the p-type well 12 and the n-type well 13 from the etchant during the etching. The photo-resist etching mask is stripped off. The resultant semiconductor structure is shown in FIG. 3D.

Subsequently, a photo-resist ion implantation mask (not shown) is patterned, and the active area for the n-channel enhancement type field effect transistor 16 is exposed to an opening of the photo-resist ion implantation mask. However, the active area for the p-channel enhancement type field effect transistor 18 is covered with the photo-resist ion implantation mask. N-type dopant impurity is ion implanted into the active area, and the lightly doped n-type source/drain regions 16d/16e are formed in a self-aligned manner with the gate electrode 16b. The photo-resist ion implantation mask is stripped off.

Another photo-resist ion implantation mask (not shown) is patterned, and the active area for the p-channel enhancement type field effect transistor 18 is exposed to an opening of the photo-resist ion implantation mask. However, the active area for the n-channel enhancement type field effect transistor 16 is covered with the photo-resist ion implantation mask. P-type dopant impurity is ion implanted into the active area, and the lightly doped p-type source/drain regions 18d/18e are formed in a self-aligned manner with the gate electrode 18b. The photo-resist ion implantation mask is stripped off.

Silicon oxide is deposited to 100 nanometers to 200 nanometers thick over the entire surface of the resultant semiconductor structure by using a chemical vapor deposition, and the silicon oxide layer is anisotropically etched without an etching mask. The side wall spacers 15f, 16c and 17f are formed on the side surfaces of the gate structure 15e, the side surfaces of the gate electrodes and the side surfaces of the emitter electrode 17d, and the composite dielectric film 24 is removed from the upper surface of the emitter electrode 17d.

Subsequently, a photo-resist ion implantation mask (not shown) is patterned, and the active area for the n-channel enhancement type field effect transistor 16 and the emitter electrode 17d are exposed to openings of the photo-resist ion implantation mask. However, the active area for tile p-channel enhancement type field effect transistor 18 is covered with the photo-resist ion implantation mask. N-type dopant impurity is ion implanted into the active area and the emitter electrode 17d. The heavily doped n-type source/drain regions 16f/16g are formed in a self-aligned manner with the side wall spacers 16c, and the emitter electrode 17 is heavily doped with the n-type dopant impurity. The photo-resist ion implantation mask is stripped off.

Figure 3E:
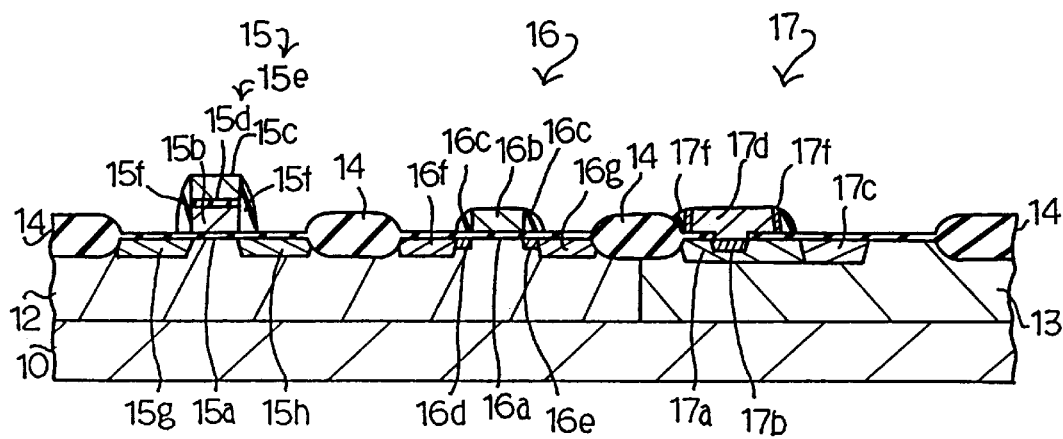

Another photo-resist ion implantation mask (not shown) is patterned, and the active area for the p-channel enhancement type field effect transistor 18 and the right portion of the base region 17a are exposed to openings of the photo-resist ion implantation mask. However, the active area for the n-channel enhancement type field effect transistor 16 and the emitter electrode 17d are covered with the photo-resist ion implantation mask. P-type dopant impurity is ion implanted into the active area and the right portion, and the heavily doped p-type source/drain regions 18f/18g are formed in a self-aligned manner with the side wall spacers on both sides of the gate electrode 18b, and the graft base region 17c is formed on the right side of the base region 17a. The photo-resist ion implantation mask is stripped off. The resultant structure is shown in FIG. 3E.

Insulating material is deposited to 500 nanometers to 1000 nanometers thick over the resultant semiconductor structure, and the floating gate type field effect transistor 15, the n-type enhancement type field effect transistor 16, the n-p-n type bipolar transistor 17 and the p-channel enhancement type field effect transistor 18 are covered with the inter-level insulating layer 19.

A photo-resist etching mask (not shown) is formed on the inter-level insulating layer 19, and the inter-level insulating layer 19 is selectively etched away so as to form the contact holes 19a. The photo-resist etching mask is stripped off.

Conductive metal such as aluminum is deposited over the entire surface of the resultant semiconductor structure, and a photo-resist etching mask is patterned on the aluminum layer. The aluminum layer is selectively etched away, and the metal wirings 20 are formed as shown in FIG. 2.

As will be appreciated from the foregoing description, the floating (gate electrode 15b and the emitter electrode 17d are formed from the same n-type doped polysilicon layer, and the control gate electrode 15c and the gate electrodes 16b/18b are patterned from the same n-type doped polysilicon layer. Thus, the deposition steps of the n-type doped polysilicon are shared between the fabrication process for the floating gate electrode 15b and the fabrication process of the n-p-n type bipolar transistor 17 and between the fabrication process for the floating gate type field effect transistor 15 and the fabrication process for the n-channel/p-channel enhancement type field effect transistors 16/18, and the process sequence for the semiconductor non-volatile memory device is made simple.

Figure 4:
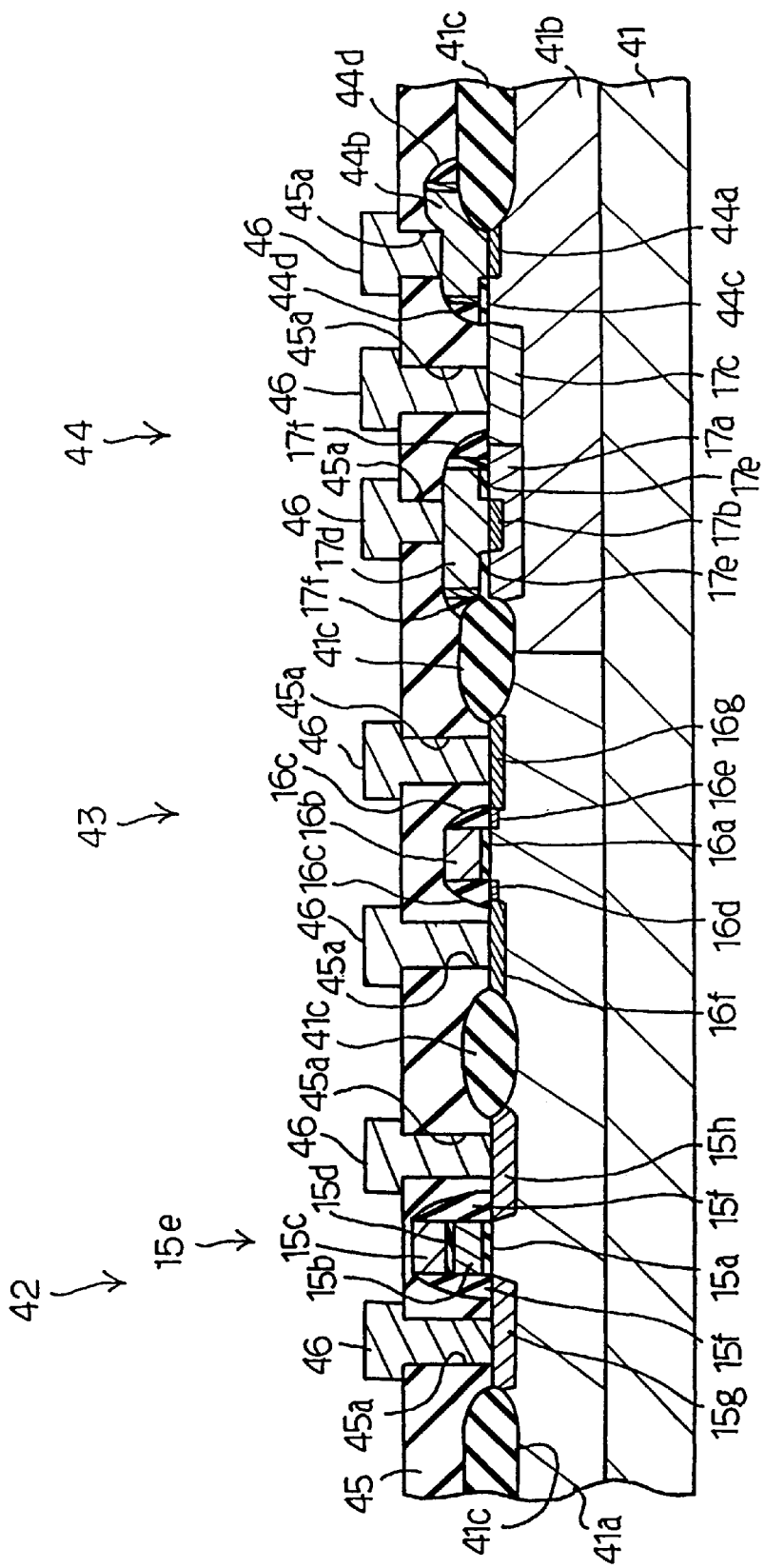
FIG. 4 is a cross sectional view showing the structure of another semiconductor non-volatile memory device according to the present invention.

Moreover, the ion-implantation step for the heavily doped n-type source/drain regions 16f/16g and the emitter electrode 17d and the ion-implantation step for the heavily doped p-type soul-ce/drain regions 18f/18g and the graft base region 17c are shared between the fabrication process for the n-channel/p-channel enhancement type field effect transistors 16/18 and the bipolar transistor 17. For this reason, the fabrication process for the semiconductor non-volatile memory device is made further simple, Second Embodiment FIG. 4 illustrates another semiconductor non-volatile memory device embodying the present invention. The semiconductor nonvolatile memory device is fabricated on a p-type silicon substrate 41, and a p-type well 41a and an n-type well 41b are formed in a surface portion of the p-type silicon substrate 41. A thick field oxide layer 41c defines active areas in the p-type well 41a and the n-type well 41b.

The semiconductor non-volatile memory device comprises floating gate type field effect transistors serving as memory cells, field effect transistors for peripheral circuits and bipolar transistors for high-speed peripheral circuits such as address decoders. However, FIG. 4 shows only one floating gate type field effect transistor 42, only one n-channel enhancement type field effect transistor 43 and only one n-p-n type bipolar transistor 44. Although the n-channel enhancement type field effect transistor 4 forms a complementary transistor together with a p-channel enhancement type field effect transistor, the p-channel enhancement type field effect transistor is deleted from FIG. 4 for the sake of simplicity.

The floating gate type field effect transistor 42 and the complementary transistor, i.e., the combination of the n-channel enhancement type field effect transistor 43 and the p-channel enhancement type field effect transistor are similar to those of the first embodiment, and, for this reason, regions, layers and electrodes of those field effect transistors 42/43 are labeled with references designating corresponding regions, corresponding layers and corresponding electrodes of the field effect transistors 15/16 without detailed description.

The bipolar transistor 44 is similar to the bipolar transistor 17 except for a heavily doped collector contact region 44a and a collector electrode 44b, and, for this reason, the other regions and the other electrodes are labeled with references designating corresponding regions and corresponding electrodes of the bipolar transistor 17 without detailed description.

The collector contact region 44a is larger in dopant concentration than the n-type well 41b, and is spaced from the graft base region 17c. The collector electrode 44b is held in contact with the collector contact region 44a, and a thin oxide layer 44c is inserted between the surface of the n-type well 41b and the collector electrode 44b. Side wall spacers 44d are provided on both sides of the collector electrode 44b. The collector electrode 44b is patterned from an n-type doped polysilicon layer together with the emitter electrode 17d and the floating gate electrode 15b.

The floating gate type field effect transistor 42, the complementary transistor and the n-p-n type bipolar transistor 44 are covered with an inter-level insulating layer 45 of 500 nanometers to 1000 nanometers thick, and contact holes 45a are formed in the inter-level insulating layer 45. Metal wirings 46 of aluminum selectively interconnect the regions and the electrodes as similar to the first embodiment. The collector contact region 44a and the collector electrode 44b decrease the contact resistance between the n-type well 41b and the associated metal wiring 46.

The bipolar transistor 44 drives heavy load at a high-speed for the high-speed peripheral circuits without increase of occupation area.

FIGS. 5A to 5E illustrate a process for fabricating the semiconductor non-volatile memory device shown in FIG. 4. The process starts with preparation of the p-type semiconductor substrate 41. The p-type semiconductor substrate 41 is selectively oxidized, and the thick field oxide layer 41c is selectively grown to 400 nanometers to 600 nanometers thick on the surface portion of the p-type semiconductor substrate 41. A photo-resist ion implantation mask (not shown) is patterned oil the resultant semiconductor structure, and exposes a predetermined area to p-type dopant impurity. The p-type dopant impurity forms the p-type well 41a. The photo-resist ion implantation mask is stripped off, and another photo-resist ion implantation masks (not shown) is patterned on the resultant semiconductor structure. The photo-resist ion implantation mask exposes another area to n-type dopant impurity, and the n-type dopant impurity forms the n-type well 41b. The thick field oxide layer 41c defines the active areas respectively assigned to the floating gate type field effect transistor 42 and the n-channel enhancement type field effect transistor 43 in the p-type well 41c and the other active areas respectively assigned to the bipolar transistor 44 and the p-channel enhancement type field effect transistor in the n-type well 41b.

Figure 5A:
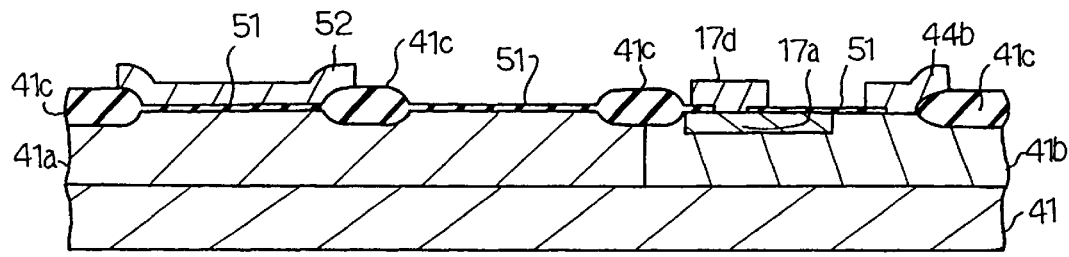
FIGS. 5A to 5E are cross sectional views showing a process for fabricating the semiconductor non-volatile memory device shown in FIG. 4.

A channel doping is carried out for adjusting the threshold levels of the field effect transistors 42/43 to appropriate values, respectively. Tile base region 17a is formed during the channel doping. Silicon oxide is grown to 8 nanometers to 15 nanometers thick on the active areas, and the active areas are covered with thin silicon oxide layers 51, respectively. The thin silicon oxide layer 51 in the leftmost active area serves as the tunnel gate oxide layer 15a, and the thin silicon oxide layer 51 over the base region 17a serves as the insulating layers 17e/44c. An emitter contact hole and a collector contact hole are formed in the silicon oxide layer 51 over the base region 17a and the n-type well 41b. Lightly-doped n-type polysilicon is deposited to 150 nanometers to 400 nanometers thick over the entire surface of the resultant semiconductor structure, and a photo-resist etching mask (not shown) is provided on the lightly-doped n-type polysilicon layer. The lightly-doped n-type polysilicon layer is partially etched away so as to leave a polysilicon strip 22, the emitter electrode 17d and the collector electrode 44b as shown in FIG. 5A.

Subsequently, the polysilicon strip 52, the emitter electrode 17d and the collector electrode 44b are covered with composite dielectric films 53a, 53b and 53c, respectively. In this instance, a silicon nitride film sandwiched between silicon oxide films serves as each of the composite dielectric films 53a, 53b and 53c as similar to the composite dielectric film 23/24.

Figure 5B:
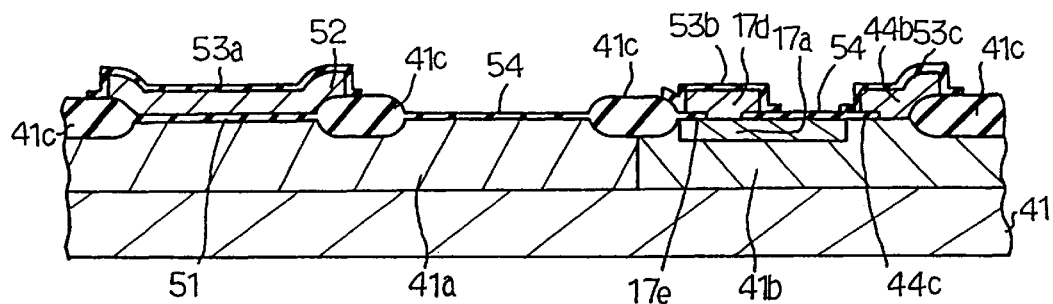

Using the composite dielectric films 53a/53b/53c as an etching mask, the silicon oxide layers 51 are etched away from the active areas for the field effect transistors and the bipolar transistor 44, and silicon oxide is grown on the exposed active areas for forming silicon oxide layers 54. The silicon oxide layers 54 on the active areas for the field effect transistors serve as the gate oxide layers such as 16a. The resultant semiconductor structure is shown in FIG. 5B.

N-type doped polysilicon is deposited over the entire surface of the resultant semiconductor structure, and the composite dielectric films 53a/53b/53c, the thick field oxide layer 41c and the silicon oxide layers 51 are covered with an n-type doped polysilicon layer.

A photo-resist etching mask (not shown) is patterned on the n-type doped polysilicon layer, and the n-type doped polysilicon layer is selectively etched away so as to leave the control gate electrode 15c and an n-type doped polysilicon strip 55. Using the photo-resist etching mask, the composite dielectric film 53a and the n-type doped polysilicon strip 52 are further etched, and the gate structure 15e is formed on the tunnel gate oxide layer 15a. The photo-resist etching mask is stripped off. Thus, the floating gate electrode 15b, the emitter electrode 17d and the collector electrode 44b are implemented by a first portion, a second portion and a third portion of the n-type doped polysilicon layer.

Figure 5C:
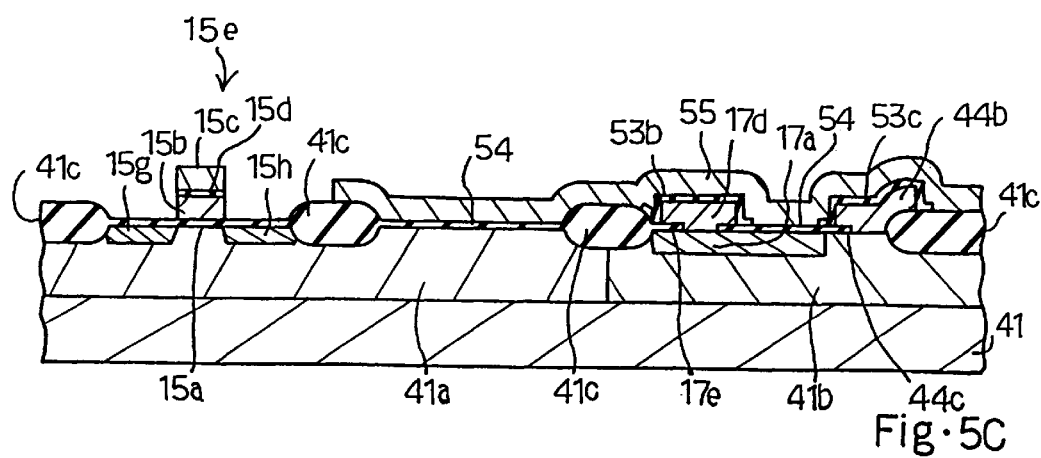

Using the gate structure 15e as an etching mask, n-type dopant impurity is ion implanted into the active area assigned to the floating gate type field effect transistor 42. The n-type dopant impurity is activated through a heat treatment, and forms the n-type source region 15g and the n-type drain region 15h as shown in FIG. 5C.

Figure 5D:
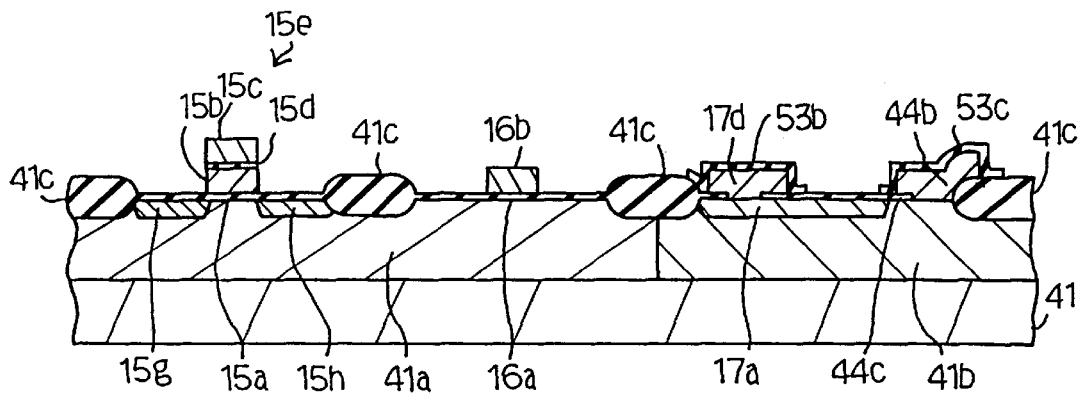

A photo-resist etching mask (not shown) is formed oil the n-type doped polysilicon strip 55, and the n-type doped polysilicon strip 55 patterned into the gate electrode of the n-channel enhancement type field effect transistor 43 and the gate electrode of the p-channel enhancement type field effect transistor. Thus, the control gate electrode 15c and the gate electrodes of the n-channel/p-channel type field effect transistors are implemented by portions of the n-type doped polysilicon. The silicon oxide layers 54 and the composite dielectric films 53b/53c prevent the emitter electrode 17d, the collector electrode 44b, the p-type well 41a and the n-type well 41b from the etchant during the etching. The photo-resist etching mask is stripped off. The resultant semiconductor structure is shown in FIG. 5D.

Subsequently, a photo-resist ion implantation mask (not shown) is patterned, and the active area for the n-channel enhancement type field effect transistor 43 is exposed to an opening of the photo-resist ion implantation mask. However, the active area for the p-channel enhancement type field effect transistor is covered with the photo-resist ion implantation mask. N-type dopant impurity is ion implanted into the active area, and the lightly doped n-type source/drain regions 16d/16e are formed in a self-aligned manner with the gate electrode 16b. The photo-resist ion implantation mask is stripped off.

Another photo-resist ion implantation mask (not shown) is patterned, and the active area for the p-channel enhancement type field effect transistor is exposed to an opening of the photo-resist ion implantation mask. However, the active area for the n-channel enhancement type field effect transistor 16 is covered with the photo-resist ion implantation mask. P-type dopant impurity is ion implanted into the active area, and the lightly doped p-type source/drain regions are formed in a self-aligned manner with the gate electrode. The photo-resist ion implantation mask is stripped off.

Silicon oxide is deposited to 100 nanometers to 200 nanometers thick over the entire surface of the resultant semiconductor structure by using a chemical vapor deposition, and the silicon oxide layer is anisotropically etched without an etching mask. The side wall spacers 15f, 16c, 17f and 44d are formed on the side surfaces of the gate structure 15e, the side surfaces of the gate electrodes, the side surfaces of the emitter electrode 17d and the side surfaces of the collector electrode 44b, and the composite dielectric films 53b/53c are removed from the upper surface of the emitter electrode 17d and the upper surface of the collector electrode 44b.

Subsequently, a photo-resist ion implantation mask (not shown) is patterned, and the active area for the n-channel enhancement type field effect transistor 43, the emitter electrode 17d and a remaining area of the n-type well 41b serving as a lightly doped collector region are exposed to openings of the photo-resist ion implantation mask. However, the active area for the p-channel enhancement type field effect transistor is covered with the photo-resist ion implantation mask. N-type dopant impurity is ion implanted into the active area for the n-channel enhancement type field effect transistor 43, the emitter electrode 17d and the collector electrode 44b. The heavily doped n-type source/drain regions 16f/16g are formed in a self-aligned manner with the side wall spacers 16c, and the emitter electrode 17 and the collector electrode 44b are heavily doped with the n-type dopant impurity. The photo-resist ion implantation mask is stripped off.

Figure 5E:
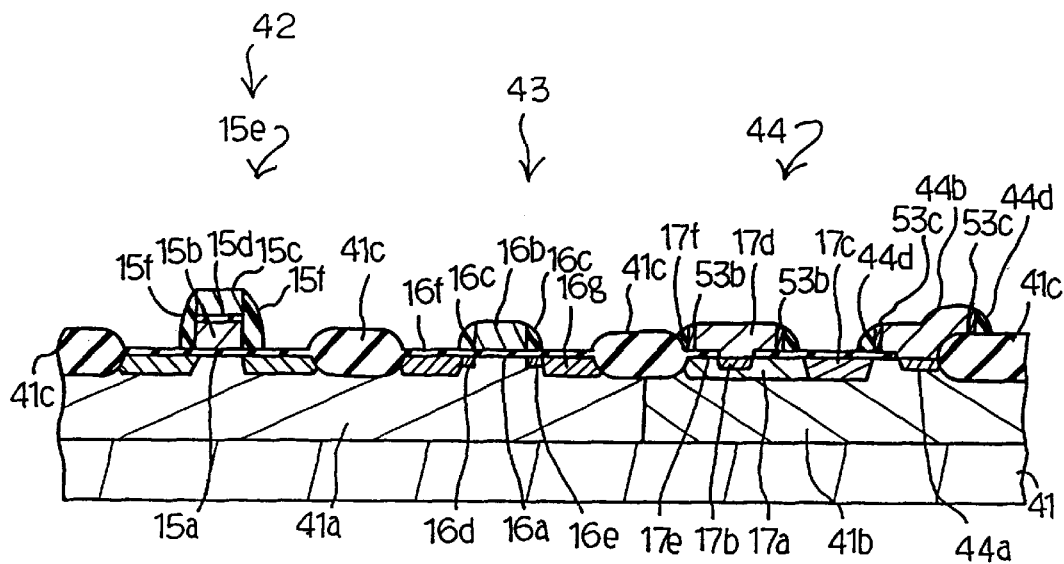

Another photo-resist ion implantation mask (not shown) is patterned, and the active area for the p-channel enhancement type field effect transistor and the right portion of the base region 17a are exposed to openings of the photo-resist ion implantation mask. However, the active area ion the n-channel enhancement type field effect transistor 43, the emitter electrode 17d and the collector electrode 44b are covered with the photo-resist ion implantation mask. P-type dopant impurity is ion implanted into the active area and the right portion, and the heavily doped p-type source/drain regions are formed in a self-aligned manner with the side wall spacers on both sides of the gate electrode of the p-channel enhancement type field effect transistor, and the graft base region 17c is formed on the right side of the base region 17b. The photo-resist ion implantation mask is stripped off. The resultant structure is shown in FIG. 5E. Insulating material is deposited to 500 nanometers to 1000 nanometers thick over the resultant semiconductor structure, and the floating gate type field effect transistor 42, the n-type enhancement type field effect transistor 43, the n-p-n type bipolar transistor 44 and the p-channel enhancement type field effect transistor are covered with the inter-level insulating layer 45.

A photo-resist etching mask (not shown) is formed on the inter-level insulating layer 45, and the inter-level insulating layer 45 is selectively etched away so as to form the contact holes 45a. The photo-resist etching mask is stripped off.

Conductive metal such as aluminum is deposited over the entire surface of the resultant semiconductor structure, and a photo-resist etching mask is patterned on the aluminum layer. The aluminum layer is selectively etched away, and the metal wirings 46 are formed as shown in FIG. 4.

As will be appreciated from the foregoing description, the floating gate electrode 15b, the emitter electrode 17d and the collector electrode 44b are formed from the same n-type doped polysilicon layer, and the control gate electrode 15c, the gate electrode 16b of the n-channel enhancement type field effect transistor 43 and the gate electrode of the p-channel enhancement type field effect transistor are patterned from the same n-type doped polysilicon layer. Thus, the deposition steps of the n-type doped polysilicon are shared between the fabrication process for the floating gate electrode 42 and the fabrication process of the n-p-n type bipolar transistor 44 and between the fabrication process for the floating, gate type field effect transistor 42 and the fabrication process for the n-channel/p-channel enhancement type field effect transistors 16, and the process sequence for the semiconductor non-volatile memory device is made simple.

Moreover, the ion-implantation step for the heavily doped n-type source/drain regions 16f/16g, the emitter electrode 17d and the collector electrode 44b and the ion-implantation step for the heavily doped p-type source/drain regions and the graft base region 17c are shared between the fabrication process for the n-channel/p-channel enhancement type field effect transistors 16 and the bipolar transistor 44. For this reason, the fabrication process for the semiconductor non-volatile memory device is made further simple.

Although particular embodiments of the present invention have been shown and described, it will be obvious to those skilled in the art that various changes and modifications may be made without departing from the spirit and scope of the present invention.

For example, the n-channel enhancement type field effect transistor and the p-channel enhancement type field effect transistor may not form the complementary transistor, and the bipolar transistor may be the p-n-p type.

What is claimed is:

1. A semiconductor non-volatile memory device fabricated on a semiconductor substrate, comprising:

a floating gate type field effect transistor serving as a memory cell, and including
a first gate insulating layer covering a first channel forming region in a first portion of said semiconductor substrate,
a floating gate electrode formed on said first gate insulating layer, the floating gate electrode comprising a first portion of a first conductive layer,
a second gate insulating layer formed on said floating gate electrode, and a control gate electrode formed on said second gate insulating layer and implemented by a first portion of a second conductive layer, and
a first source region and a first drain region formed on both sides of said first channel forming region in said first portion;

a first field effect transistor forming a part of a peripheral circuit, and including
a third gate insulating layer covering a second channel forming region in a second portion of said semiconductor substrate isolated from said first portion,
a first gate electrode formed on said third gate insulating layer, and
a second source region and a second drain region formed on both sides of said second channel forming region in said second portion; and a bipolar transistor forming a part of another peripheral circuit operative at higher speed than said peripheral circuit, and including
a collector region formed in a third portion of said semiconductor substrate isolated from said first and second portions,
a base region formed in said collector region, an emitter region formed in said base region, and
an emitter electrode held in contact with said emitter region, the emitter electrode comprising a second portion of said first conductive layer heavier in dopant concentration than said floating gate electrode.

2. The semiconductor non-volatile memory device as set forth in claim 1, in which said first gate electrode is implemented by a second portion of said second conductive layer.

3. The semiconductor non-volatile memory device as set forth in claim 2, in which a first insulating spacing layer is inserted between said base region and a lower surface of said emitter electrode, and said first gate insulating layer and said first insulating spacing layer are implemented by a first portion and a second portion of an insulating layer.

4. The semiconductor non-volatile memory device as set forth in claim 2, further comprising
a second field effect transistor opposite in channel conductivity type to said first field effect transistor, forming another part of said peripheral circuit and including
a fourth gate insulating layer covering a third channel forming region in a fourth portion of said semiconductor substrate isolated from said first, second and third portions and implemented by a third portion of said insulating layer,
a second gate electrode formed on said fourth gate insulating layer and implemented by a third portion of said second conductive layer, and
a third source region and a third drain region formed on both sides of said third channel forming region.

5. The semiconductor non-volatile memory device as set forth in claim 3, in which said bipolar transistor further includes
a collector contact region formed in said third portion of said semiconductor substrate and larger in dopant impurity than a remaining sub-portion of said third portion, and
a collector electrode held in contact with said collector contact region and implemented by a third portion of said first conductive layer.

6. The semiconductor non-volatile memory device as set forth in claim 5, in which a second insulating spacing layer is inserted between a lower surface of said collector electrode and said remaining sub-portion adjacent to said collector contact region, and is implemented by a third portion of said insulating layer.

7. The semiconductor non-volatile memory device as set forth in claim 1, in which said second source region and said second drain region are doped with a part of a first dopant impurity, and said emitter electrode is doped with another part of said first dopant impurity.

8. A semiconductor non-volatile memory device fabricated on a semiconductor substrate, comprising:

a floating gate type field effect transistor serving as a memory cell, and including
a first gate insulating layer covering a first channel forming region in a first portion of said semiconductor substrate, a floating gate electrode formed on said first gate insulating layer and implemented by a first portion of a first conductive layer, a second gate insulating layer formed on said floating gate electrode, and a control gate electrode formed on said second gate insulating layer and implemented by a first portion of a second conductive layer, and a first source region and a first drain region formed on both sides of said first channel forming region in said first portion;

a first field effect transistor forming a part of a peripheral circuit, and including a third gate insulating layer covering a second channel forming region in a second portion of said semiconductor substrate isolated from said first portion, a first gate electrode formed on said third gate insulating layer, and a second source region and a second drain region formed on both sides of said second channel forming region in said second portion, and a bipolar transistor forming a part of another peripheral circuit operative at higher speed than said peripheral circuit, and including a collector region formed in a third portion of said semiconductor substrate isolated from said first and second portions, a base region formed in said collector region an emitter region formed in said base region, and an emitter electrode held in contact with said emitter region, implemented by a second portion of said first conductive layer and heavier in dopant concentration than said floating electrode;

wherein said base region has an intrinsic base sub-region beneath said emitter region and a graft base sub-region larger in dopant concentration than said intrinsic base sub-region, said second source region, said second drain region and said emitter electrode are doped with a first part of a first dopant impurity, a second part of said first dopant impurity and a third part of said first dopant impurity, respectively, and said third source region, said third drain region and said graft base sub-region are doped with a first part of a second dopant impurity opposite to said first dopant impurity, a second part of said second dopant impurity and a third part of said second dopant impurity and a third part of said second dopant impurity, respectively.

* * * * *